United States Patent
Koyama et al.

(10) Patent No.: US 11,361,125 B2
(45) Date of Patent: Jun. 14, 2022

(54) SUPPORT METHOD, DESIGN SUPPORT APPARATUS, AND A NON-TRANSITORY RECORDING MEDIUM STORING A DESIGN SUPPORT PROGRAM

(71) Applicant: Mitsubishi Electric Corporation, Tokyo (JP)

(72) Inventors: Hiroyuki Koyama, Tokyo (JP); Tomoyuki Nagata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 259 days.

(21) Appl. No.: 16/614,552

(22) PCT Filed: Jun. 8, 2017

(86) PCT No.: PCT/JP2017/021278
§ 371 (c)(1),
(2) Date: Nov. 18, 2019

(87) PCT Pub. No.: WO2018/225207
PCT Pub. Date: Dec. 13, 2018

(65) Prior Publication Data
US 2020/0184126 A1    Jun. 11, 2020

(51) Int. Cl.
*G06F 30/18* (2020.01)
*G06F 30/12* (2020.01)
*G06F 30/31* (2020.01)

(52) U.S. Cl.
CPC .............. *G06F 30/18* (2020.01); *G06F 30/12* (2020.01); *G06F 30/31* (2020.01)

(58) Field of Classification Search
CPC ..................................................... G06F 30/18
(Continued)

(56) References Cited

U.S. PATENT DOCUMENTS

2012/0203775 A1   8/2012   Tsudaka
2016/0155089 A1   6/2016   Nakashima et al.
(Continued)

FOREIGN PATENT DOCUMENTS

CN    108780302 A    11/2018
JP    2012181821 A    9/2012
JP    2015036901 A    2/2015

OTHER PUBLICATIONS

International Search Report (PCT/ISA/210) dated Aug. 22, 2017, by the Japan Patent Office as the International Searching Authority for International Application No. PCT/JP2017/021278.
(Continued)

*Primary Examiner* — Eric D Lee
(74) *Attorney, Agent, or Firm* — Buchanan Ingersoll & Rooney PC

(57) ABSTRACT

A design support method includes: acquiring reference diagrams which are control logic diagrams created in the past, and an editing object diagram; and applying each of analysis rules to each control logic diagram, and analyzing the control logic part included in each control logic diagram. The analysis rules satisfy a relation in which a control logic part corresponding to an analysis rule at a higher hierarchy level contains a control logic part corresponding to an analysis rule at a lower hierarchy level. The design support method further includes: specifying, as a similar diagram, a reference diagram including a control logic part common with the control logic part included in the editing object diagram, among the reference diagrams, based on an analysis result; and presenting a control logic part having a hierarchical relation with the common control logic part, among control logic parts included in the similar diagram.

15 Claims, 16 Drawing Sheets

(58) Field of Classification Search
USPC .............................................................. 703/1
See application file for complete search history.

(56) References Cited

U.S. PATENT DOCUMENTS

2017/0228589 A1* 8/2017 Parapurath ........... G06V 30/413
2019/0043230 A1   2/2019 Nagata et al.

OTHER PUBLICATIONS

Written Opinion (PCT/ISA/237) dated Aug. 22, 2017, by the Japan Patent Office as the International Searching Authority for International Application No. PCT/JP2017/021278.
Notice of Reasons for Refusal for JP 2017-551357 dated Nov. 7, 2017 with English translation.

* cited by examiner

FIG.4
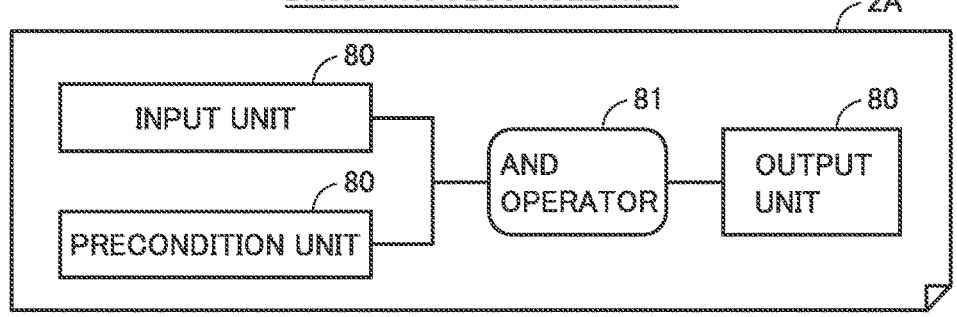
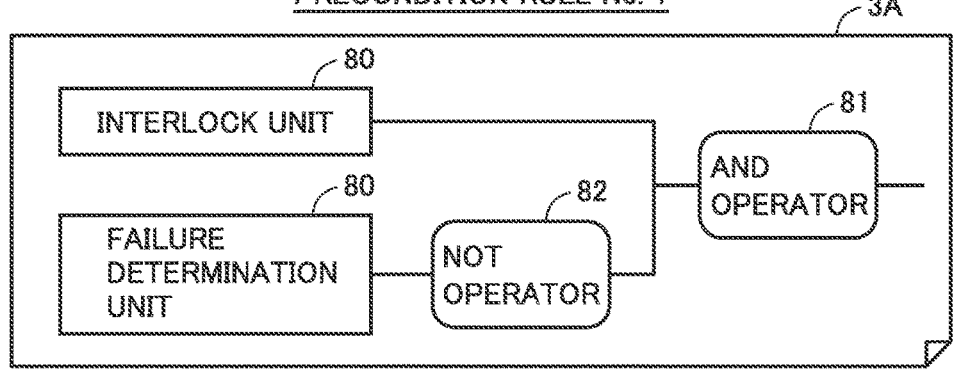
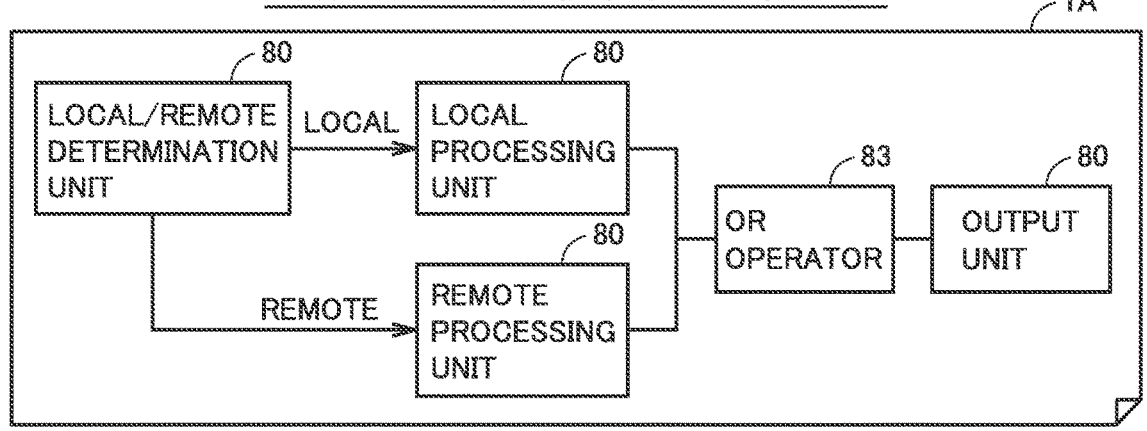

FIG.10

| CONTROL LOGIC DIAGRAM ID | HIERARCHICAL ANALYSIS RULE ID | HIERARCHY LEVEL | CONTROL LOGIC PART ID | HIERARCHY LEVEL | CONTROL LOGIC PART ID | ... |
|---|---|---|---|---|---|---|
| D1 | R1 | BASIC PROCESS PART LEVEL (L3) | L3A | BASIC PROCESS LEVEL (L2) | L2A | ... |
| D2 | R2 | BASIC PROCESS PART LEVEL (L3) | L3B | BASIC PROCESS LEVEL (L2) | L2B | ... |
| D3 | R3 | BASIC PROCESS PART LEVEL (L3) | L3C | — | — | — |

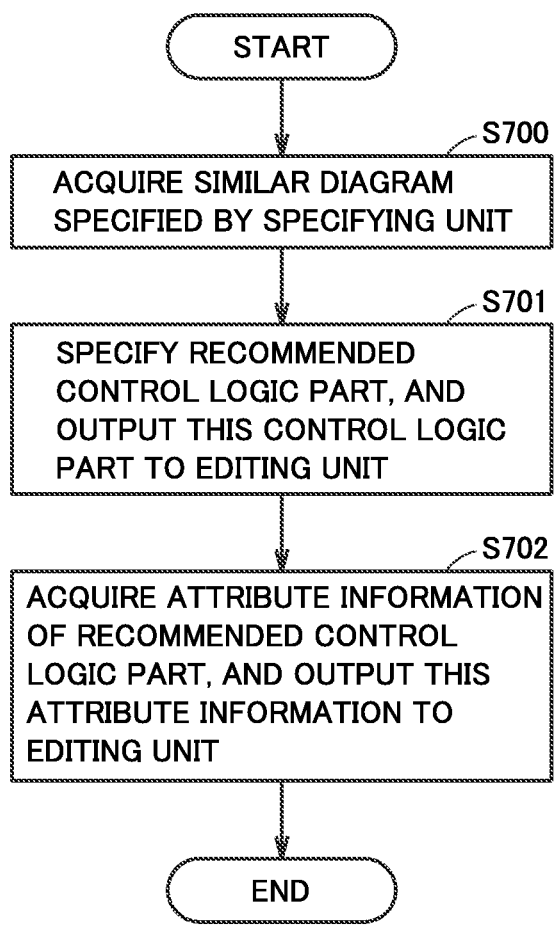

SUPPORT METHOD, DESIGN SUPPORT APPARATUS, AND A NON-TRANSITORY RECORDING MEDIUM STORING A DESIGN SUPPORT PROGRAM

TECHNICAL FIELD

The present disclosure relates to a technique for supporting creation of control logic diagrams.

BACKGROUND ART

In the development of monitoring control systems of electric power systems and plants of water supply and sewerage, control logic diagrams may be used that describe operation schemes defining the operation specifications of the equipment, using flowcharts and logical operations. Depending on the scale of the development, about several hundred control logic diagrams may be required. Accordingly, there is a demand for efficient creation of the control logic diagrams.

For example, PTL 1 (Japanese Patent Laying-Open No. 2012-181821) describes a logic diagram searching device that searches for, for a logic described in a certain control logic diagram, a similar logic included in another control logic diagram, using logical connection information or positional information of signals or operation elements in the control logic diagram. Accordingly, frequently described logics are componentized, and thus the number of required control logic diagrams can be reduced.

CITATION LIST

Patent Literature

PTL 1: Japanese Patent Laying-Open No. 2012-181821

SUMMARY OF INVENTION

Technical Problem

However, in the technique described in PTL 1, a searchable similar logic is a logic that matches with a reference logic. That is, the technique disadvantageously cannot find a logic partially different from the reference logic. In the case of plant processes for example, there are exceptional processes with respect to normal processes in many cases. In such cases, the efficiency in creation of control logic diagrams cannot be fully enhanced.

The present disclosure has been made in view of such a problem. An object in an aspect is to provide a design support method that can efficiently create control logic diagrams. An object in another aspect is to provide a design support apparatus that can efficiently create control logic diagrams. An object in another aspect is to provide a design support program that can efficiently create control logic diagrams.

Solution to Problem

According to one aspect, a design support method includes acquiring a control logic diagram composed of a control logic part defining a control content. The control logic diagram includes a plurality of reference diagrams which are control logic diagrams created in the past, and an editing object diagram which is a control logic diagram to be edited. The design support method further includes applying each of a plurality of analysis rules for analyzing the control logic part included in the control logic diagram to each of the plurality of reference diagrams and to the editing object diagram, and analyzing the control logic part included in each of the plurality of reference diagrams and in the editing object diagram. The plurality of analysis rules are hierarchized and satisfy a relation in which a control logic part corresponding to an analysis rule at a higher hierarchy level contains a control logic part corresponding to an analysis rule at a lower hierarchy level. The design support method further includes specifying, as a similar diagram, a reference diagram including a control logic part common with the control logic part included in the editing object diagram, among the plurality of reference diagrams, based on an analysis result of the analyzing; and presenting a control logic part having a hierarchical relation with the common control logic part, among control logic parts included in the similar diagram.

According to another aspect, a design support apparatus includes a storage unit to store a control logic diagram composed of a control logic part defining a control content. The control logic diagram includes a plurality of reference diagrams which are control logic diagrams created in the past, and an editing object diagram which is a control logic diagram to be edited. The design support apparatus further includes an analyzing unit to apply each of a plurality of analysis rules for analyzing the control logic part included in the control logic diagram to each of the plurality of reference diagrams and to the editing object diagram, and analyze the control logic part included in each of the plurality of reference diagrams and in the editing object diagram. The plurality of analysis rules are hierarchized and satisfy a relation in which a control logic part corresponding to an analysis rule at a higher hierarchy level contains a control logic part corresponding to an analysis rule at a lower hierarchy level. The design support apparatus further includes a specifying unit to specify, as a similar diagram, a reference diagram including a control logic part common with the control logic part included in the editing object diagram, among the plurality of reference diagrams, based on an analysis result produced by the analyzing unit; and a presenting unit to present a control logic part having a hierarchical relation with the common control logic part, among control logic parts included in the similar diagram.

According to another aspect, a design support program is configured to cause a computer to execute acquiring a control logic diagram composed of a control logic part defining a control content. The control logic diagram includes a plurality of reference diagrams which are control logic diagrams created in the past, and an editing object diagram which is a control logic diagram to be edited. The design support program is further configured to cause the computer to execute applying each of a plurality of analysis rules for analyzing the control logic part included in the control logic diagram to each of the plurality of reference diagrams and to the editing object diagram, and analyzing the control logic part included in each of the plurality of reference diagrams and in the editing object diagram. The plurality of analysis rules are hierarchized and satisfy a relation in which a control logic part corresponding to an analysis rule at a higher hierarchy level contains a control logic part corresponding to an analysis rule at a lower hierarchy level. The design support program is further configured to cause the computer to execute specifying, as a similar diagram, a reference diagram including a control logic part common with the control logic part included in the editing object diagram, among the plurality of reference diagrams, based on an analysis result of the analyzing; and presenting a control logic part having a hierarchical relation with the common control logic part, among control logic parts included in the similar diagram.

Advantageous Effects of Invention

In an aspect, control logic diagrams can be efficiently created.

BRIEF DESCRIPTION OF DRAWINGS

FIG. 4 is a diagram showing concrete examples of the analysis rules included in an analysis rule data base (DB).

FIG. 10 is a diagram showing an example data structure of a control logic diagram DB.

FIG. 16 is a flowchart showing the operation of a presenting unit according to embodiment 2.

DESCRIPTION OF EMBODIMENTS

Figure 1:
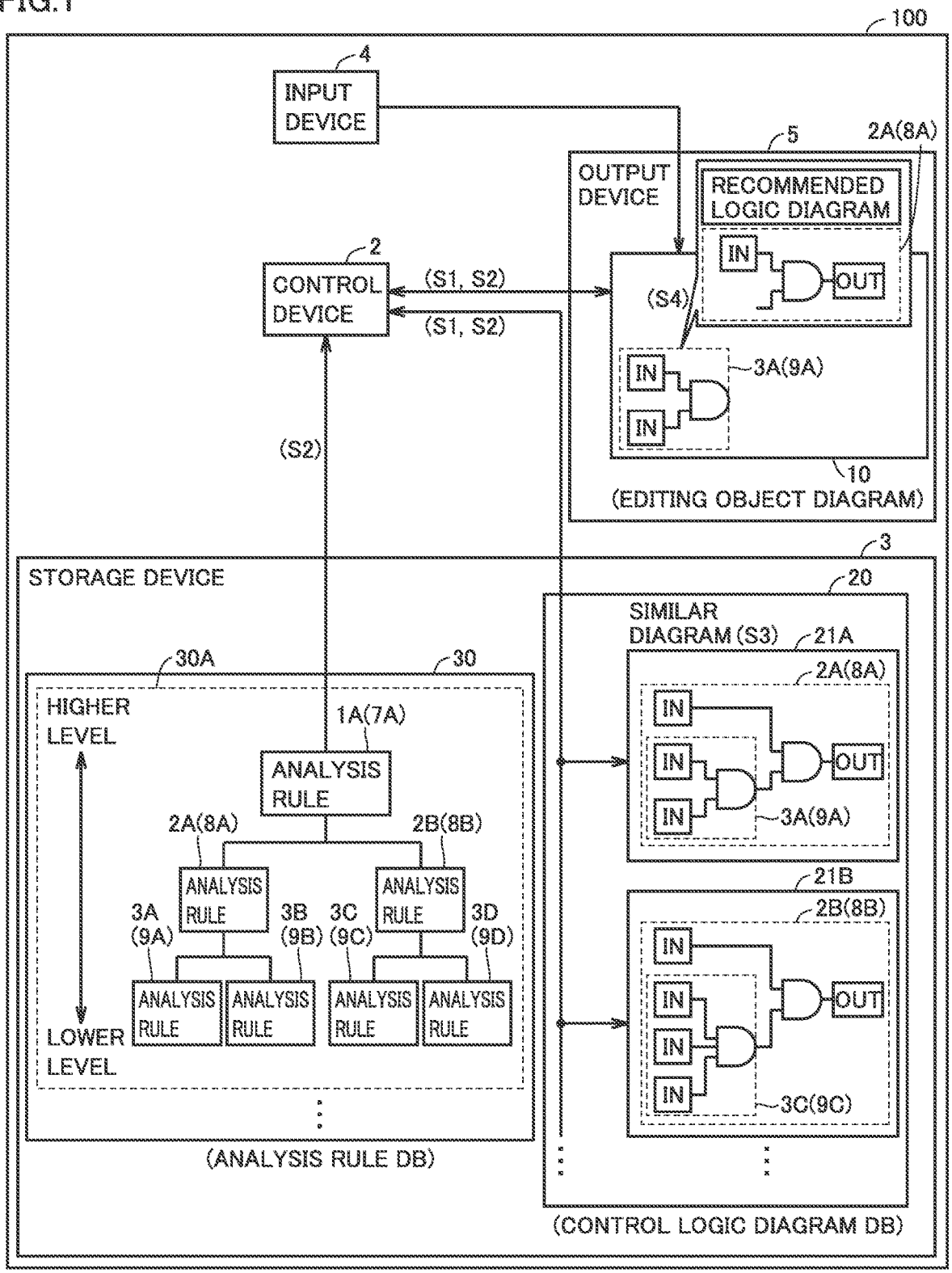
FIG. 1 is a diagram showing an example main hardware configuration of a design support apparatus according to embodiment 1.

Hereinafter embodiments of the present invention are described with reference to the drawings. In the following description, like parts are denoted by like reference characters. Those parts have the same names and functions. Accordingly, the detailed description of the parts is not repeated.

Embodiment 1

<A. Hardware Configuration of Design Support Apparatus 100>

With reference to FIG. 1, the hardware configuration of a design support apparatus 100 according to the present embodiment is described. FIG. 1 is a diagram showing an example main hardware configuration of design support apparatus 100.

Design support apparatus 100 is, for example, a personal computer (PC), a tablet-type device, a smartphone, or another computing device. Design support apparatus 100 is already installed with a development support tool for supporting the development of monitoring control systems of electric power systems and plants of water supply and sewerage. Typically, the development support tool is an application that can design control logic diagrams with, for example, a function block diagram (FBD) language or a sequential function chart (SFC) language.

Design support apparatus 100 includes, as a main hardware configuration, a central processing unit (CPU) 2 to perform an arithmetic process, a storage device 3 to store information, an input device 4 to receive an input of information, and an output device 5 to display, for example, a design support screen.

Control device 2 is composed of, for example, at least one integrated circuit. The integrated circuit is composed of, for example, at least one central processing unit (CPU), at least one application specific integrated circuit (ASIC), at least one field programmable gate array (FPGA), or any combination thereof.

Storage device 3 is, for example, a hard disk drive (HDD), a random access memory (RAM) and read only memory (ROM), or another memory. Storage device 3 may be integrated with or separated from design support apparatus 100.

Input device 4 is, for example, a mouse, a keyboard, a touch panel, or another operational device that can receive a user operation input. Input device 4 may be integrated with or separated from design support apparatus 100.

Output device 5 is, for example, a liquid crystal display, an organic electroluminescence display, or another display. Output device 5 may be integrated with or separated from design support apparatus 100.

<B. Design Support Method with Design Support Apparatus 100>

With reference to FIG. 1, a design support method with design support apparatus 100 is outlined.

Storage device 3 stores control logic diagrams created by the user in the past, as a control logic diagram DB 20. Hereinafter, a control logic diagram created by the user in the past is also referred to as a "reference diagram". In the example of FIG. 1, control logic diagram DB 20 includes reference diagrams 21A, 21B. Reference diagrams 21A, 21B are also referred to as reference diagrams 21 as a generic term. In contrast, a control logic diagram to be edited by the user is also referred to as an "editing object diagram". In the example of FIG. 1, an editing object diagram 10 is displayed on output device 5 as a control logic diagram that is being edited.

The control logic diagram is composed by combining various control logic parts componentized in advance. Each control logic part represents a partial process constituting a control logic diagram and is defined by a combination of any of, for example, logical operators and signal lines between the logical operators.

Storage device 3 further stores, as an analysis rule DB 30, analysis rules for analyzing the contents of control logic parts included in control logic diagrams. The analysis rules are hierarchized. Hereinafter, a set of the hierarchized analysis rules is also referred to as a "hierarchical analysis rule". Analysis rule DB 30 includes one or more hierarchical analysis rule. In the example of FIG. 1, analysis rule DB 30 includes a hierarchical analysis rule 30A. Hierarchical analysis rule 30A is composed of, for example, analysis rules 1A, 2A, 2B, and 3A to 3D.

Typically, each analysis rule is associated with a control logic part. That is, each analysis rule is associated with a combination of any of, for example, logical operators and signal lines. A relation is satisfied in which a control logic part at a higher hierarchy level contains a control logic part at a lower hierarchy level. In the example of FIG. 1, analysis rule 1A is at a higher hierarchy level than analysis rules 2A, 2B, and control logic part 7A corresponding to analysis rule 1A contains control logic parts 8A, 8B corresponding to analysis rules 2A, 2B. Analysis rule 2A is at a higher hierarchy level than analysis rules 3A, 3B, and control logic part 8A corresponding to analysis rule 2A contains control logic parts 9A, 9B corresponding to analysis rules 3A, 3B. Analysis rule 2B is at a higher hierarchy level than analysis rules 3C, 3D, and control logic part 8B corresponding to analysis rule 2B contains control logic parts 9C, 9D corresponding to analysis rules 3C, 3D.

The content of the control logic part corresponding to each analysis rule and the hierarchy level of each analysis rule may be set in advance, or may be set by the user freely.

Design support apparatus 100 according to the present embodiment recommends to the user an optimal control logic part suitable as a control logic part that is being edited in editing object diagram 10. More specifically, control device 2 acquires editing object diagram 10 and reference diagram 21 (see step S1). After that, control device 2 applies each analysis rule included in analysis rule DB 30 to editing object diagram 10 and reference diagram 21, and analyzes the content of the control logic part included in each control logic diagram (see step S2). In this way, control device 2 specifies a matching portion that matches with the analysis rule in each control logic diagram. In the example of FIG. 1, editing object diagram 10 matches with analysis rule 3A, which indicates that editing object diagram 10 includes control logic part 9A corresponding to analysis rule 3A. Reference diagram 21A matches with analysis rules 2A, 3A, which indicates that reference diagram 21A includes control logic parts 8A, 9A corresponding to analysis rules 2A, 3A. Reference diagram 21B matches with analysis rules 2B, 3C, which indicates that reference diagram 21B includes control logic parts 8B, 9C corresponding to analysis rules 2B, 3C.

Based on the analysis result, control device 2 specifies among reference diagrams 21, as a similar diagram, a reference diagram including a control logic part that is common with the control logic part included in editing object diagram 10 (see step S3). In the example of FIG. 1, editing object diagram 10 and reference diagram 21A include control logic part 9A in common, and thus reference diagram 21A is specified as a similar diagram to editing object diagram 10. The term "common" as used herein means not only a perfect match but also a substantial match (i.e., being similar).

Among control logic parts 8A, 9A included in reference diagram 21A as a similar diagram, control device 2 presents, as a recommended object, at least one of control logic parts 8A, 9A having a hierarchical relation with control logic part 8A shared in common with editing object diagram 10 (see step S4). In the example of FIG. 1, control logic part 8A is presented as a recommended object. The user can reflect control logic part 8A in editing object diagram 10 by designating the presented control logic part 8A using input device 4.

In this way, by analyzing the similarity between editing object diagram 10 and reference diagram 21 using analysis rules having a hierarchical relation, control device 2 can recommend a control logic by focusing not on local similarity but on global similarity in the control logic diagram.

Thus, an appropriate control logic part can be presented even if many kinds of control logic parts are included, and the user's design efficiency can be improved.

Preferably, control device 2 presents, as a recommended object, control logic part 8A that is at a higher hierarchy level than control logic part 9A shared in common with editing object diagram 10, among control logic parts 8A, 9A included in reference diagram 21A as a similar diagram. Typically, control device 2 presents, as a recommended object, control logic part 8A at the highest hierarchy level, among control logic parts 8A, 9A included in reference diagram 21A as a similar diagram. Thus, control device 2 can present a higher-level control logic part that is highly likely to be designed next to control logic part 9A. As a result, control device 2 can recommend a control logic part in accordance with the user's design concept, thus further improving the user's design efficiency.

The control logic part to be presented as a recommended object is not limited to one control logic part, but may be a plurality of control logic parts. For example, if a similar diagram includes a plurality of control logic parts that are at a higher level than the control logic part shared in common by a similar diagram and an editing object diagram, all of the plurality of control logic parts may be presented. The control logic part to be presented is not necessarily a control logic part that is at a higher level than the control logic part shared in common by a similar diagram and an editing object diagram. Rather, the control logic part to be presented may be a control logic part that is at the same hierarchy level as the common control logic part, or a control logic part that is at a lower hierarchy level than the common control logic part.

<C. Functional Configuration of Design Support Apparatus 100>

Figure 2:
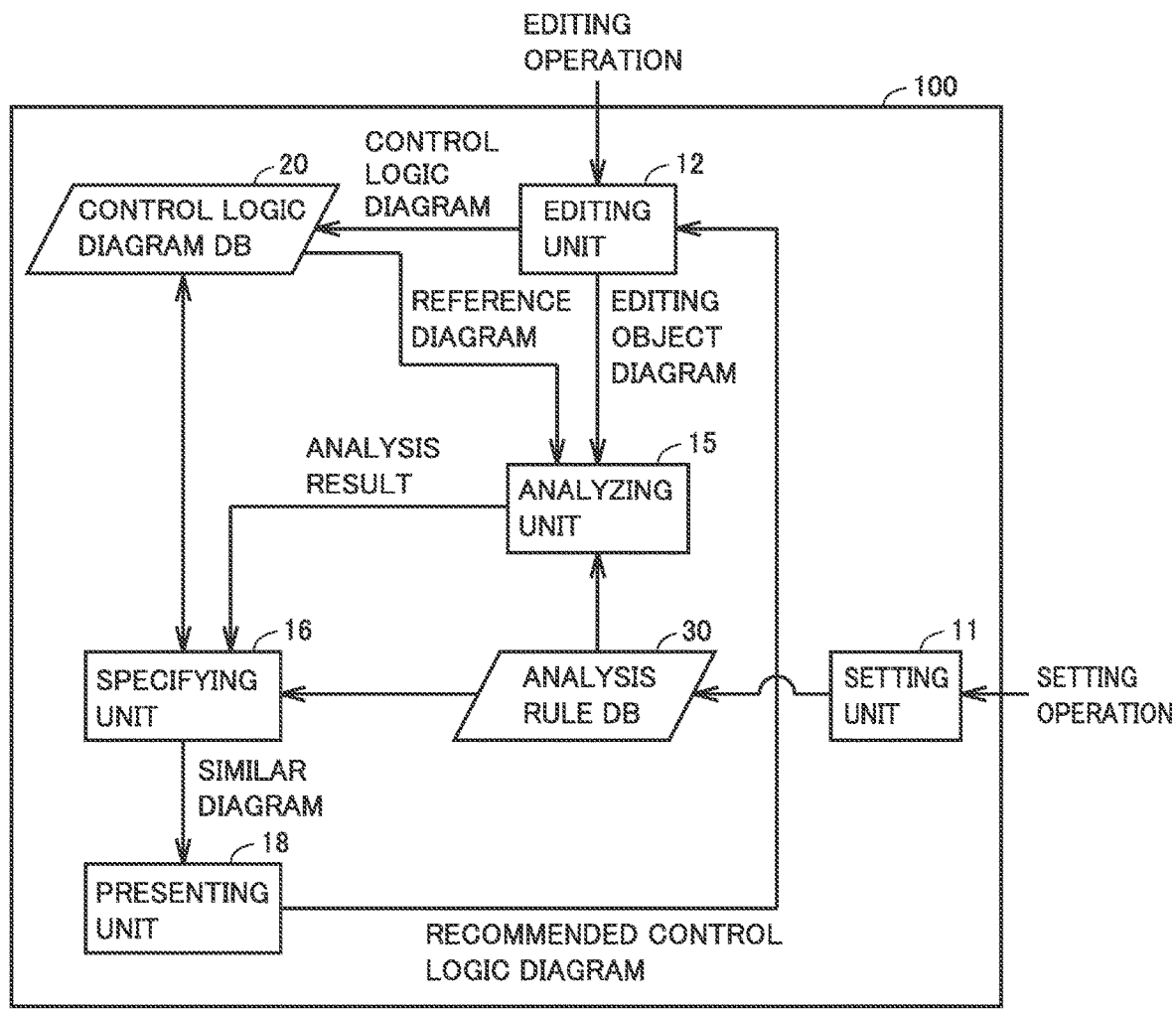
FIG. 2 is a diagram showing an example functional configuration of a design support apparatus according to embodiment 1.

With reference to FIG. 2, the function of design support apparatus 100 is described. FIG. 2 is a diagram showing an example functional configuration of design support apparatus 100.

As shown in FIG. 2, design support apparatus 100 includes a setting unit 11 to make a setting for analysis rule DB 30, an editing unit 12 to edit a control logic, an analyzing unit 15 to extract a control logic part included in a control logic diagram, a specifying unit 16 to specify any of reference diagrams 21 that is similar to editing object diagram 10, and a presenting unit 18 to present a recommend control logic part.

Setting unit 11 receives a setting related to an analysis rule included in analysis rule DB 30. By way of example, the settings to be received by setting unit 11 include a setting for the control logic part to be associated with each analysis rule, a setting for the hierarchy level of each analysis rule, and a setting for the connection relation between the analysis rules.

Editing unit 12 provides a setting screen (user interface) for editing a control logic diagram. The user can edit the control logic diagram by operating the setting screen using input device 4. When editing unit 12 receives a saving operation, editing unit 12 stores a control logic diagram that is being edited on the setting screen in control logic diagram DB 20.

Analyzing unit 15 acquires a control logic diagram that is being edited (i.e., editing object diagram 10) displayed on the setting screen, and acquires the control logic diagrams created in the past (i.e., reference diagrams 21) from control logic diagram DB 20. After that, analyzing unit 15 applies each analysis rule included in analysis rule DB 30 to the acquired control logic diagrams, and analyzes the contents of the control logic parts included in the control logic diagrams. Thus, analyzing unit 15 specifies a matching portion that matches with the analysis rule in the control logic diagrams. The analysis result produced by analyzing unit 15 is outputted to specifying unit 16.

Based on the analysis result produced by analyzing unit 15, specifying unit 16 specifies, as a similar diagram, a control logic diagram including a control logic part that is common with the control logic part included in editing object diagram 10, among the control logic diagrams created in the past (i.e., reference diagrams 21). The specified similar diagram is outputted to presenting unit 18.

Presenting unit 18 presents, as a recommended object, a control logic part having a hierarchical relation with the control logic part shared in common with editing object diagram 10, among the control logic parts included in the similar diagram. Typically, presenting unit 18 presents, as a recommended object, a control logic part that is at a higher level than the control logic part shared in common with editing object diagram 10, among the control logic parts included in the similar diagram. The recommended object is outputted to editing unit 12.

<D. Control Logic Diagram>

Figure 3:
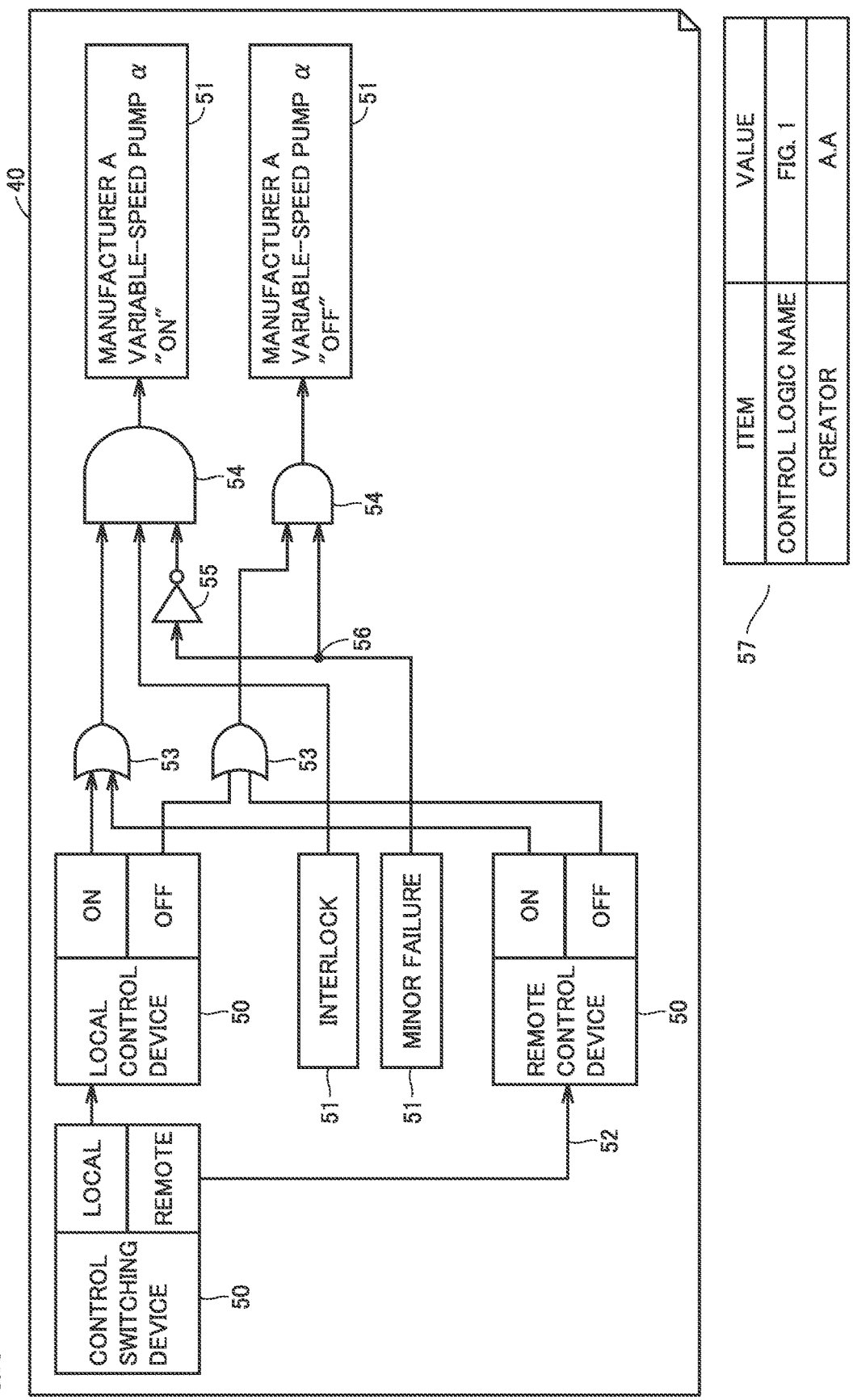
FIG. 3 is a diagram showing an example control logic diagram.

With reference to FIG. 3, a control logic diagram that defines a process for a device to be controlled is described. FIG. 3 is a diagram showing an example control logic diagram.

FIG. 3 shows a control logic diagram 40 as an example control logic diagram. In control logic diagram 40, logical operation elements are shown by MIL logic symbols. In control logic diagram 40, connecting lines 52 indicate connection paths of input signals and output signals between device components 50, such as a control switching device, a local control device, and a remote control device; or processes 51, such as an interlock and a minor failure. In control logic diagram 40, the direction of signal is indicated by arrows. Branching of signal is indicated by a branch point 56. Examples of logical operation elements include an OR operator 53, an AND operator 54, a NOT operator 55, and an exclusive OR operator.

Control logic diagram 40 is not limited to the example of FIG. 3, but may be any diagram described in any notation that can show the relation between input and output signals and logical operators for a process, such as a function block diagram (FBD) language or a sequential function chart (SFC) language defined by IEC 61131-3.

<E. Analysis Rule>

Figure 5:
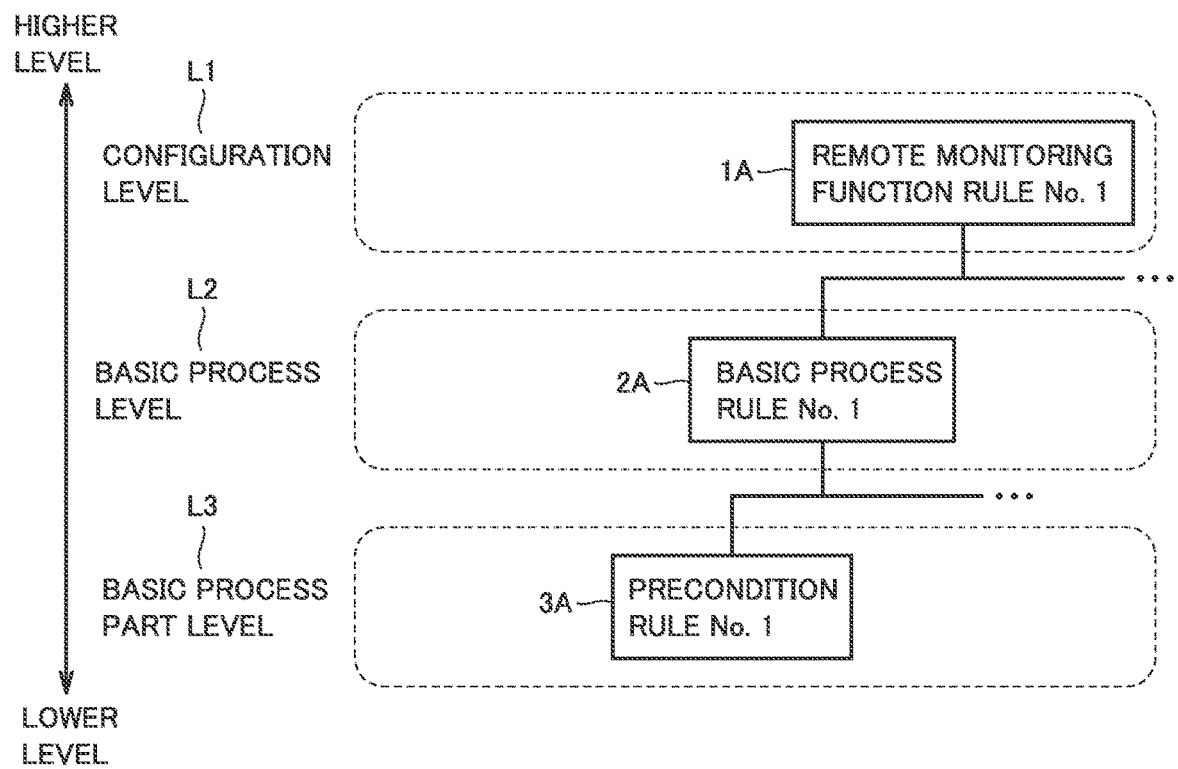
FIG. 5 is a diagram showing an example hierarchical analysis rule.

With reference to FIG. 4 and FIG. 5, the analysis rules included in analysis rule DB 30 (see FIG. 1) are described.

FIG. 4 is a diagram showing concrete examples of the analysis rules included in analysis rule DB 30. As described above, the analysis rules are for extracting control logic parts from control logic diagrams.

The example of FIG. 4 shows three analysis rules: "basic process rule No. 1", "precondition rule No. 1", and "remote monitoring function rule No. 1". The analysis rules are composed of process parts 80 and logical operator parts. Examples of the logical operator parts include an AND operator part 81, a NOT operator part 82, and an OR operator part 83.

Analyzing unit 15 searches for a portion that matches with process parts 80 and logical operator parts in an analysis rule. In the search for the matching portion, the element in a control logic diagram that corresponds to the content of process part 80 may be, for example, a single signal, or may be a plurality of devices or processes connected via logical operators.

The "basic process rule No. 1" in FIG. 4 indicates that, if the output from the input unit included in process parts 80 and the output from the precondition unit included in process parts 80 are both true, then the output unit included in process parts 80 is executed. This indicates that an output is made in response to an input to the input unit under the condition that the precondition is satisfied.

The "precondition rule No. 1" in FIG. 4 indicates that, if the output from the interlock unit included in process parts 80 is true, and the output from the failure determination unit included in process parts 80 is false, then the output from the rule is true as a whole. This indicates that the precondition is satisfied when the interlock unit has not started up, i.e., when the operation is normally performed without any failure.

The "remote monitoring function rule No. 1" in FIG. 4 indicates that the local/remote determination unit included in process parts 80 determines local control or remote control. With local control, the local processing unit included in process parts 80 executes local control; whereas with remote control, the remote processing unit included in process parts 80 executes remote control. The result of the local control or remote control is outputted to the output unit included in process parts 80.

FIG. 5 is a diagram showing an example hierarchical analysis rule where analysis rules are hierarchized by setting unit 11. The hierarchical analysis rule is a rule in which individual analysis rules are hierarchized into respective levels, such as a configuration level L1, a basic process level L2, and a basic process part level L3.

The hierarchy levels satisfy a relation in which an analysis rule at a higher hierarchy level contains an analysis rule at a lower hierarchy level. Basic process part level L3 designates the content of process part 80 in the basic process rule corresponding to the basic process level. In FIG. 5, the "basic process rule No. 1" at basic process level L2 is at a higher level than the "precondition rule No. 1" at basic process part level L3. In this case, the detail of the precondition unit included in process parts 80 of the "basic process rule No. 1" in FIG. 4 is the "precondition rule No. 1". In FIG. 5, the "remote monitoring function rule No. 1" at configuration level L1 is at a higher level than the "basic process rule No. 1" at basic process level L2. In this case, the detail of process part 80 of the "remote monitoring function rule No. 1" is the "basic process rule No. 1". In this way, the hierarchization of the analysis rules allows easy switching of the details of control logic diagrams.

<F. Control Structure of Design Support Apparatus 100>

As described in FIG. 2, design support apparatus 100 includes, as the functional components, setting unit 11, editing unit 12, analyzing unit 15, specifying unit 16, and presenting unit 18. The processes implemented by these functional components are implemented by control device 2 executing programs. In another aspect, the processes may be executed by circuit elements or other hardware, in part or in whole.

Hereinafter, with reference to FIG. 6 to FIG. 13, the control flows of the functional components shown in FIG. 2 are described one by one.

[F1. Control Flow of Setting Unit 11]

Figure 6:
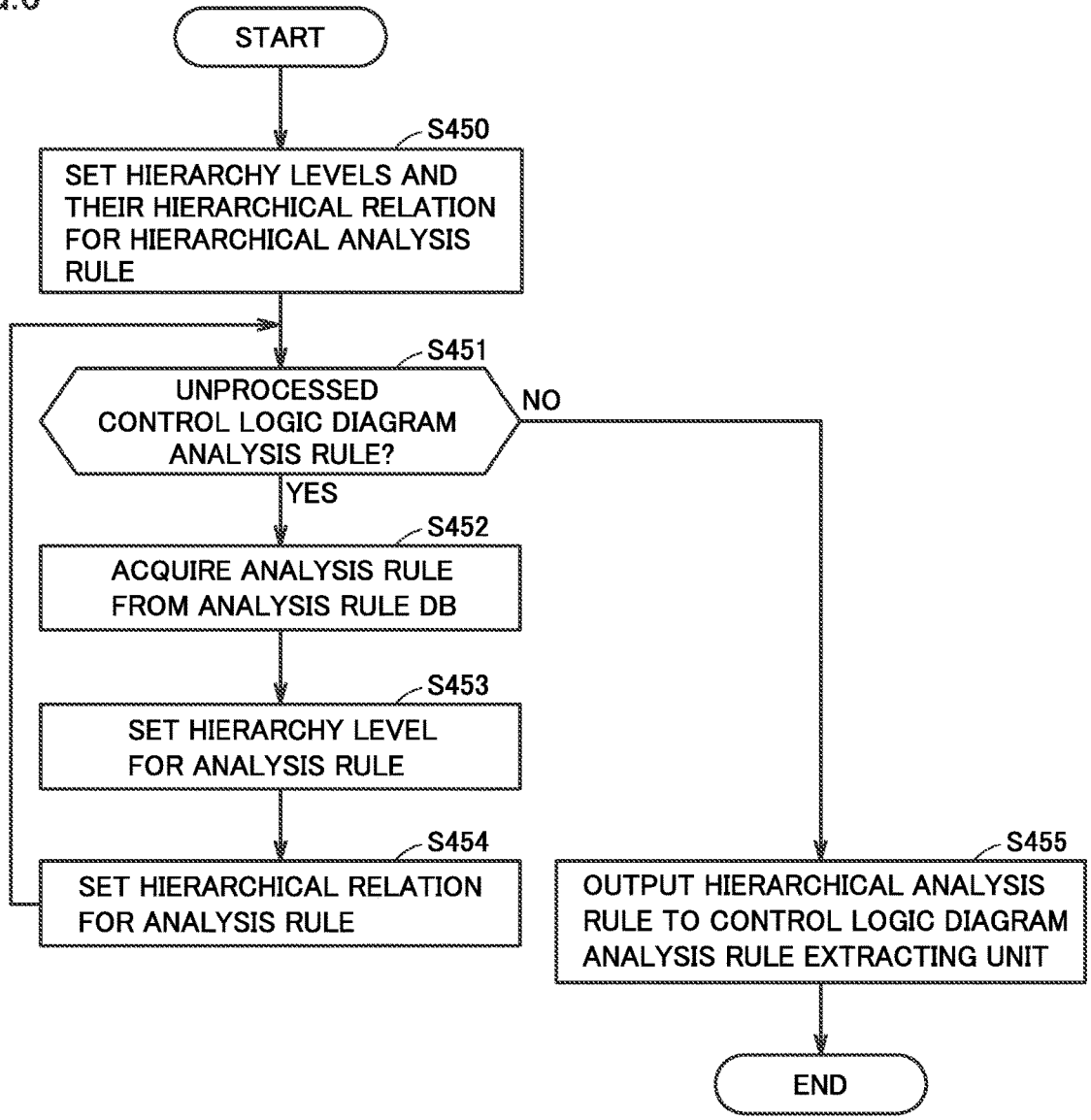
FIG. 6 is a flowchart showing the operation of a setting unit according to embodiment 1.

First, with reference to FIG. 6, the control flow of setting unit 11 is described. FIG. 6 is a flowchart showing the operation of setting unit 11.

At step S450, setting unit 11 sets hierarchy levels and the hierarchical relation between the hierarchy levels for a hierarchical analysis rule. The setting is made by the user, for example.

At step S451, setting unit 11 determines whether or not the hierarchical analysis rule includes an unprocessed analysis rule. If setting unit 11 determines that the hierarchical analysis rule includes an unprocessed analysis rule (YES at step S451), setting unit 11 switches the control to step S452. Otherwise (NO at step S451), control device 2 switches the control to step S455.

At step S452, setting unit 11 acquires one unprocessed analysis rule from analysis rule DB 30.

At step S453, setting unit 11 sets a hierarchy level in the hierarchical analysis rule for the unprocessed analysis rule. The setting is made by the user, for example.

At step S454, setting unit 11 sets a hierarchical relation for the analysis rule. The setting is made by the user, for example.

At step S455, setting unit 11 stores the processed hierarchical analysis rule into analysis rule DB 30, and ends the process shown in FIG. 6.

[F2. Control Flow of Editing Unit 12]

Figure 7:
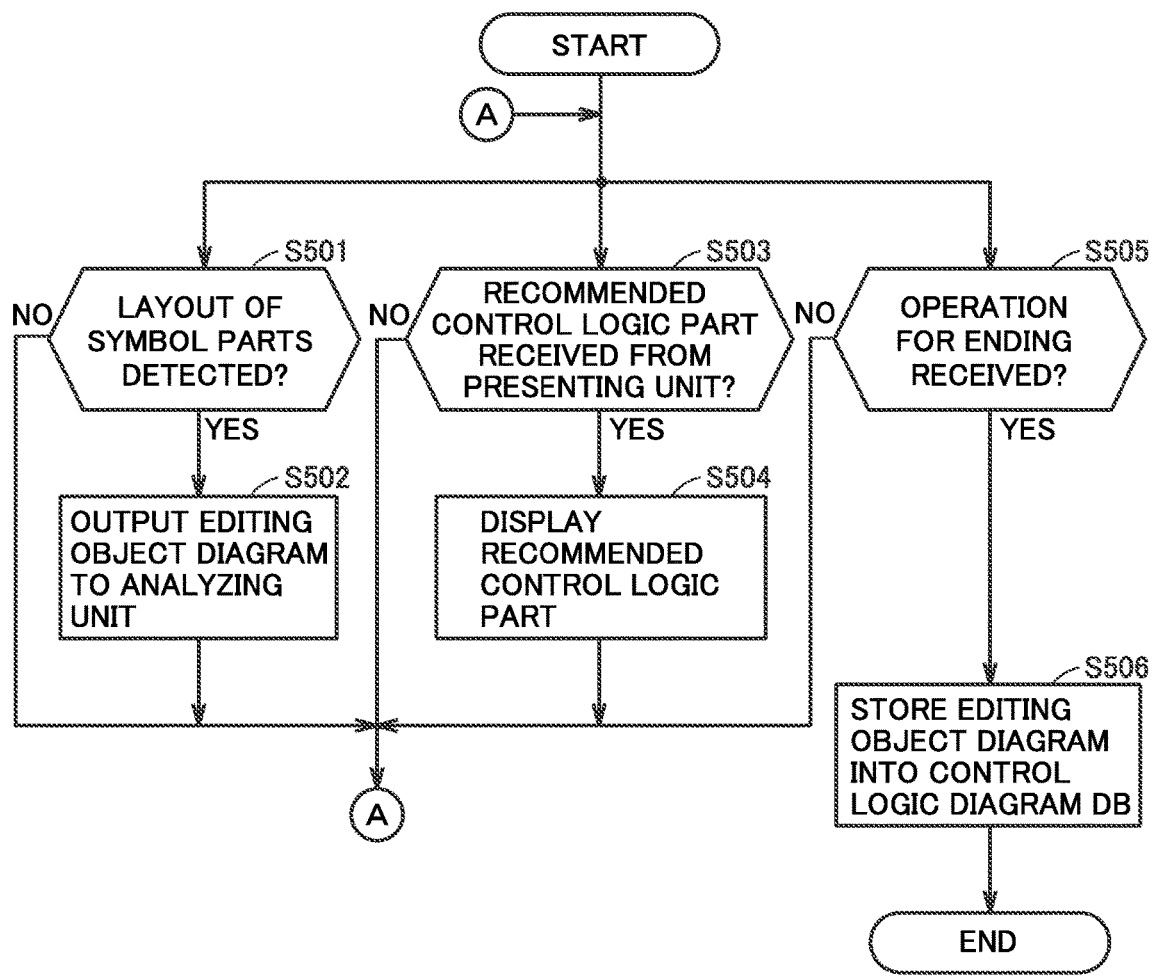
FIG. 7 is a flowchart showing the operation of an editing unit according to embodiment 1.

Next, with reference to FIG. 7, the control flow of editing unit 12 is described. FIG. 7 is a flowchart showing the operation of editing unit 12.

The processes of steps S501, S503, S505 shown in FIG. 7 are sequentially, repeatedly executed.

At step S501, editing unit 12 determines whether or not the layout of symbol parts have been detected on the setting screen for a control logic diagram. Examples of the symbol parts include control logic parts, logical operators, and arrows indicating the directions of signal. The symbol parts to be detected are registered in advance. If editing unit 12 determines that the layout of symbol parts have been detected on the setting screen for a control logic diagram (YES at step S501), editing unit 12 switches the control to step S502. Otherwise (NO at step S501), editing unit 12 returns the control to the start position.

At step S502, editing unit 12 outputs the control logic diagram that is currently being edited (i.e., editing object diagram 10) to analyzing unit 15.

At step S503, editing unit 12 determines whether or not a recommended control logic part has been received from presenting unit 18. If editing unit 12 determines that a recommended control logic part has been received from presenting unit 18 (YES at step S503), editing unit 12 switches the control to step S504. Otherwise (NO at step S503), editing unit 12 returns the control to the start position.

At step S504, editing unit 12 displays the recommended control logic part on the setting screen for the control logic diagram on output device 5 of design support apparatus 100.

At step S505, editing unit 12 determines whether or not an operation for ending has been received from the user. The operation for ending is, for example, an operation for saving the control logic diagram. If editing unit 12 determines that an operation for ending has been received from the user (YES at step S505), editing unit 12 switches the control to step S506. Otherwise (NO at step S505), editing unit 12 returns the control to the start position.

At step S506, editing unit 12 stores the control logic diagram that is being edited on the setting screen, into control logic diagram DB 20.

[F3. Control Flow of Analyzing Unit 15]

Figure 8:
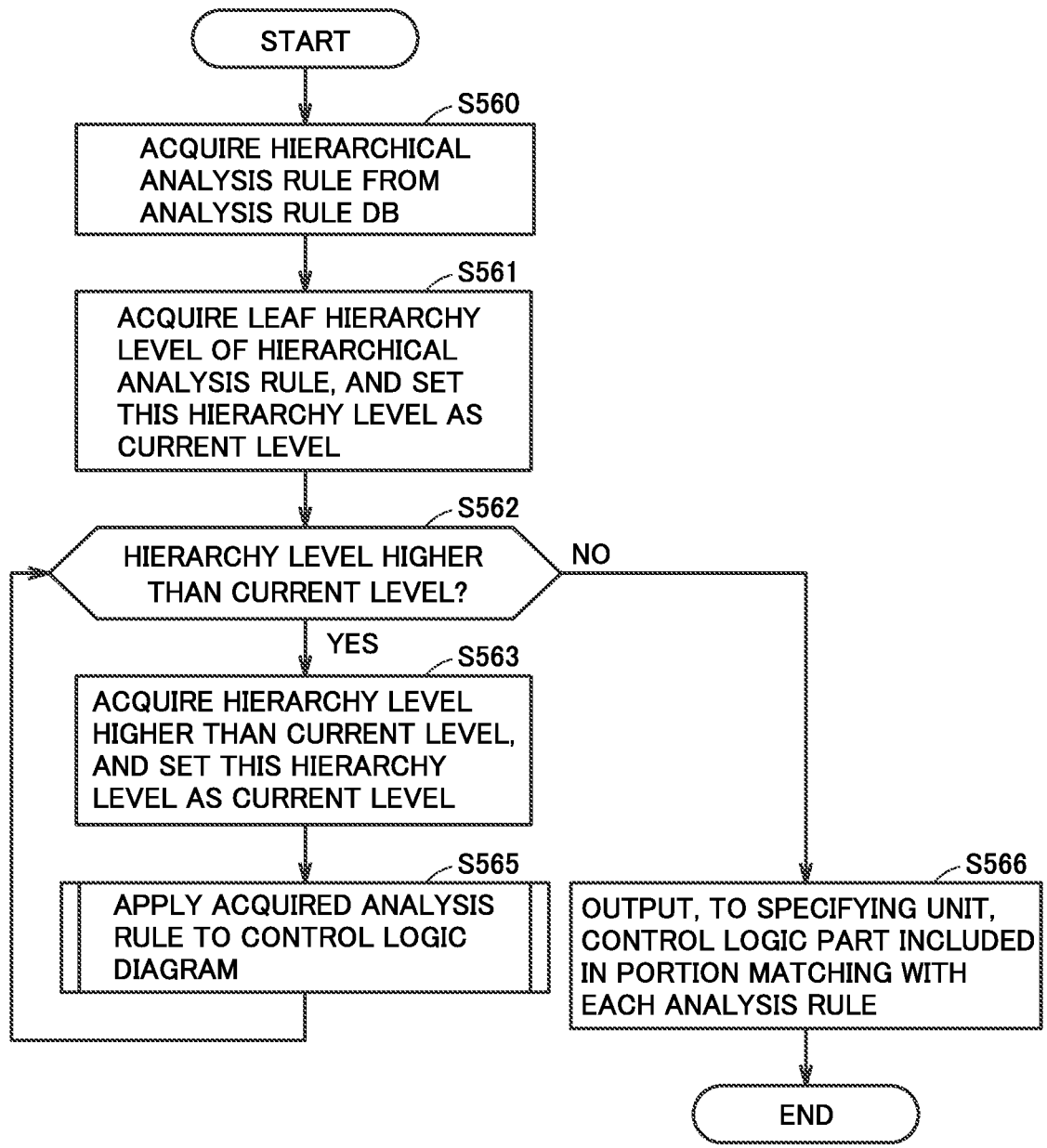
FIG. 8 is a flowchart showing the operation of an analyzing unit according to embodiment 1.

Next, with reference to FIG. 8 to FIG. 11, the control flow of analyzing unit 15 is described. FIG. 8 is a flowchart showing the operation of analyzing unit 15.

At step S560, analyzing unit 15 acquires one of the hierarchical analysis rules from analysis rule DB 30. Typically, analyzing unit 15 acquires one unprocessed hierarchical analysis rule.

At step S561, analyzing unit 15 acquires a leaf hierarchy level (i.e., the lowest hierarchy level) of the hierarchical analysis rule, and sets the hierarchy level as a current hierarchy level (hereinafter also referred to as a "current level"). The current level refers to a hierarchy level that is currently being focused on in the tree structure of the hierarchical analysis rule.

At step S562, analyzing unit 15 determines whether or not the hierarchical analysis rule acquired at step S560 includes a hierarchy level higher than the current level. If analyzing unit 15 determines that the hierarchical analysis rule includes a hierarchy level higher than the current level (YES at step S562), analyzing unit 15 switches the control to step S563. Otherwise (NO at step S562), analyzing unit 15 switches the control to step S566.

At step S563, analyzing unit 15 acquires the hierarchy level that is the next higher than the current level. More specifically, analyzing unit 15 acquires the lowest hierarchy level among the hierarchy levels higher than the current level. Analyzing unit 15 sets the acquired hierarchy level as the current level.

At step S565, analyzing unit 15 applies the analysis rules to the control logic diagram. The process of step S565 will be described in detail with reference to FIG. 9.

At step S566, analyzing unit 15 outputs, to specifying unit 16, control logic parts included in a matching portion that matches with each analysis rule in the control logic diagram.

Figure 9:
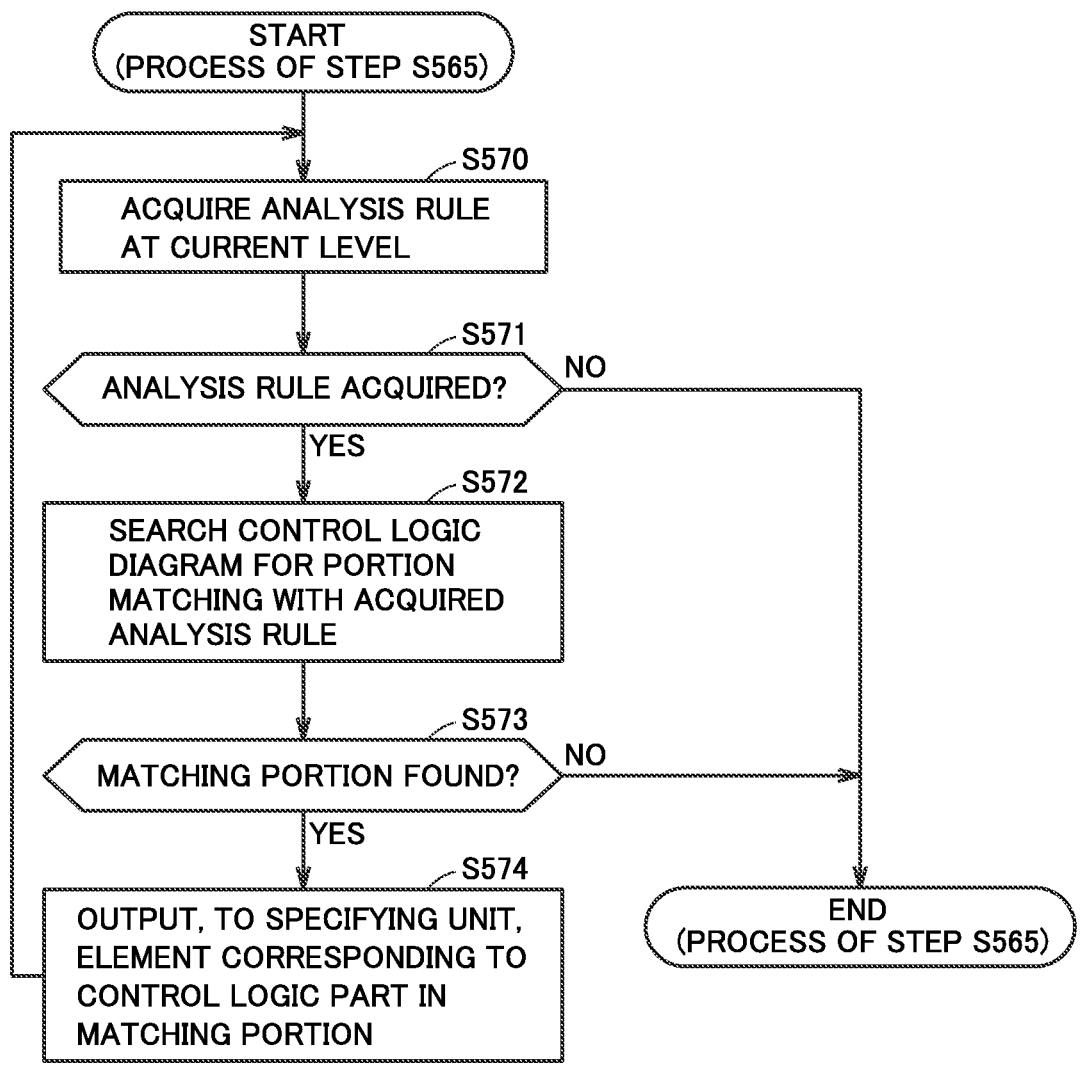
FIG. 9 is a flowchart showing the process of step S565 shown in FIG. 8.

FIG. 9 is a flowchart showing the process of step S565 shown in FIG. 8. The following further describes the process of step S565 with reference to FIG. 9.

At step S570, analyzing unit 15 acquires one analysis rule at the current level. Typically, analyzing unit 15 acquires one unprocessed analysis rule at the current level.

At step S571, analyzing unit 15 determines whether or not an analysis rule was acquired at step S570. If an analysis rule was not acquired, it means that the process has been completed for all the analysis rules. If analyzing unit 15 determines that an analysis rule was acquired at step S570 (YES at step S571), analyzing unit 15 switches the control to step S572. Otherwise (NO at step S571), analyzing unit 15 ends the process of step S565.

At step S572, analyzing unit 15 applies the analysis rule acquired at step S570 to the control logic diagram, and searches the control logic diagram for a portion that matches with the analysis rule. Whether a portion matches with the analysis rule is determined based on, for example, the degree of similarity between the control logic part included in the searched control logic diagram and the control logic part represented by the analysis rule. Typically, the degree of similarity is calculated based on the proportion of the operation elements and signal lines that correspond between the control logic diagram and the analysis rule, to the operation elements and signal lines included in the control logic diagram and the analysis rule. By way of example, the function for calculating the degree of similarity is preferably an increasing function of the number of operation elements and signal lines that correspond between the control logic diagram and the analysis rule, and a decreasing function of the number of operation elements and signal lines that do not correspond. The function may be expressed by, for example, equation (1) as below.

$$s1 = 2 * \{\alpha Na + (1-\alpha)La\} / \{(\alpha(N0+N1) + (1-\alpha)(L0+L1)\} \quad (1)$$

The character "s1" in equation (1) denotes the degree of similarity as the calculation result. The character "Na" in equation (1) denotes the number of operation elements that correspond between the control logic diagram and the analysis rule. The character "La" in equation (1) denotes the number of signal lines that correspond between the control logic diagram and the analysis rule. The character "N0" in equation (1) denotes the number of operation elements included in the control logic diagram. The character "L0" denotes the number of signal lines included in the control logic diagram. The character "N1" in equation (1) denotes the number of operation elements included in the control logic part that corresponds to the analysis rule to be applied. The character "L1" denotes the number of signal lines included in the control logic part that corresponds to the analysis rule to be applied. The character "a" in equation (1) is a parameter of not less than 0 and not more than 1.

Preferably, analyzing unit 15 weights the degree of similarity in accordance with the hierarchy level of the analysis rule to be applied. By way of example, the weighted degree of similarity is calculated based on equation (2) as below.

$$s2 = w*s1 \qquad (2)$$

The character "s2" in equation (2) denotes the weighted degree of similarity. The character "w" in equation (2) denotes the weight. The higher the level of the analysis rule to be applied is, the heavier the weight "w" is. The character "s1" in equation (2) denotes the degree of similarity "s1" in equation (1).

The method of calculating the degree of similarity is not limited to equations (1), (2), but any calculation method may be employed that can calculate the degree of similarity between the control logic diagram and the analysis rule.

At step S573, analyzing unit 15 determines whether or not a matching portion that matches with the analysis rule was found in the control logic diagram. By way of example, analyzing unit 15 determines that a matching portion that matches with the analysis rule was found in the control logic diagram if the degree of similarity calculated at step S572 is higher than a predetermined threshold value. If analyzing unit 15 determines that a matching portion that matches with the analysis rule was found in the control logic diagram (YES at step S573), analyzing unit 15 switches the control to step S574. Otherwise (NO at step S573), analyzing unit 15 ends the process shown in FIG. 9.

At step S574, analyzing unit 15 outputs, to specifying unit 16, the element in the control logic diagram that corresponds to the content of process part 80 of the analysis rule. By way of example, the element may be a single signal, or may be a plurality of devices or processes connected via logical operators.

FIG. 10 is a diagram showing an example data structure of control logic diagram DB 20 shown in FIG. 1 and FIG. 2. The analysis result obtained by execution of the processes in FIG. 8 and FIG. 9 is written into control logic diagram DB 20. That is, control logic diagram DB 20 stores not only the control logic diagrams created in the past, but also the hierarchical analysis rules applicable to the control logic diagrams, and the matching portions at the hierarchy levels in the hierarchical analysis rules.

More specifically, control logic diagram DB 20 includes control logic diagram identifications (IDs) 22 for identifying control logic diagrams, and analysis results 23 produced by analyzing unit 15. Analysis results 23 include hierarchical analysis rule IDs 24 for identifying applicable hierarchical analysis rules, hierarchy levels 25 indicating the hierarchy levels of the applicable analysis rules, and control logic part IDs 26 for identifying control logic parts corresponding to the analysis rules. The number of hierarchy levels 25 and control logic part IDs 26 that are held is equal to the number of the applicable analysis rules. If a plurality of hierarchical analysis rules are applicable, rows are added to control logic diagram DB 20 in accordance with the number of applicable hierarchical analysis rules.

In the example of FIG. 10, the control logic diagram corresponding to the control logic diagram ID "D1" can be applied with the hierarchical analysis rule corresponding to the hierarchical analysis rule ID "R1", applied with the control logic part corresponding to the control logic part ID "L3A" at the hierarchy level "basic process part level", and applied with the control logic part corresponding to the control logic part ID "L2A" at the hierarchy level "basic process level". Similarly, the control logic diagram corresponding to the control logic diagram ID "D2" can be applied with the hierarchical analysis rule corresponding to the hierarchical analysis rule ID "R2", applied with the control logic part corresponding to the control logic part ID "L3B" at the hierarchy level "basic process part level", and applied with the control logic part corresponding to the control logic part ID "L2B" at the hierarchy level "basic process level". The control logic diagram corresponding to the control logic diagram ID "D3" can be applied with the hierarchical analysis rule corresponding to the hierarchical analysis rule ID "R3", and applied with the control logic part corresponding to the control logic part ID "L3C" at the hierarchy level "basic process part level".

Figure 11:
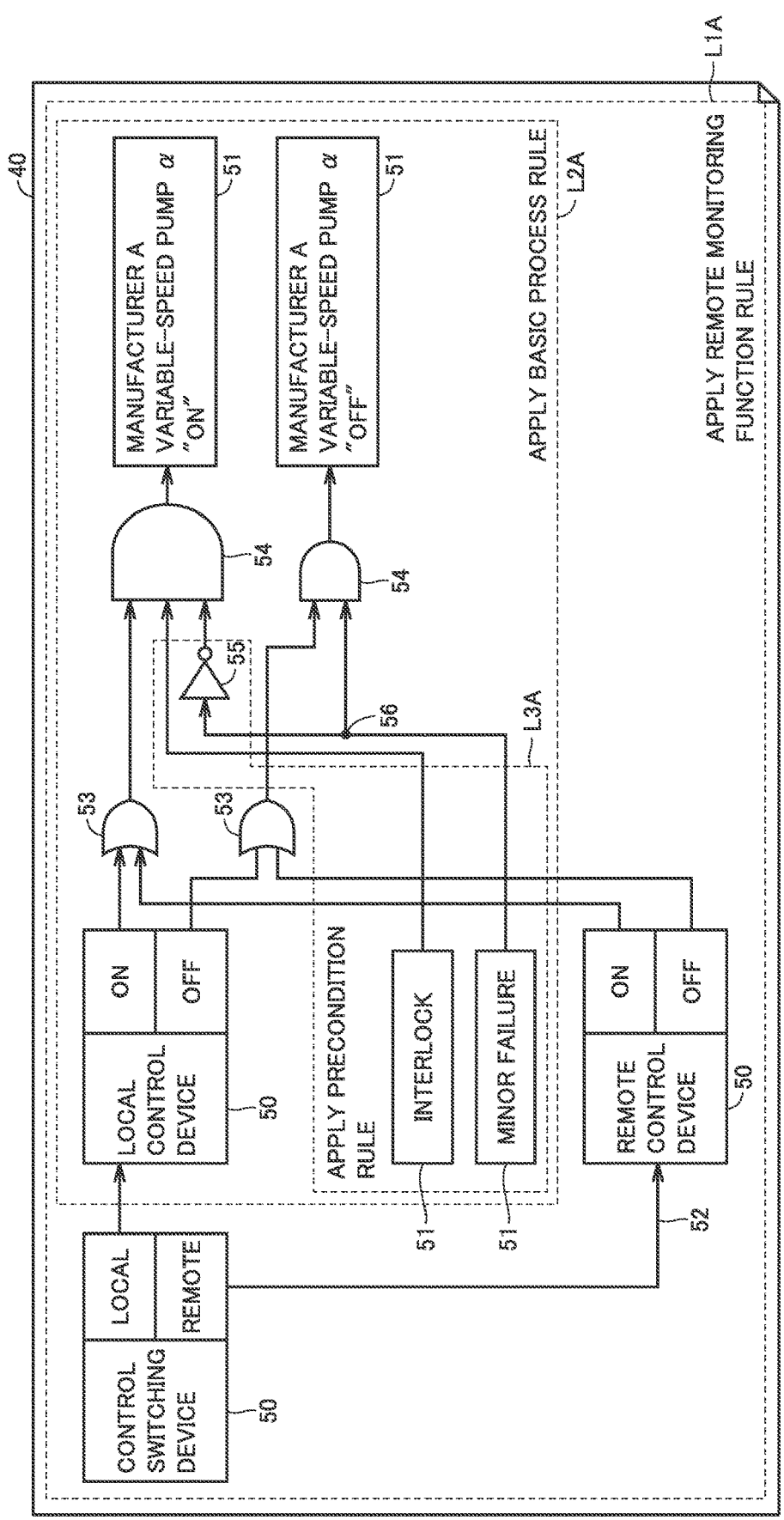
FIG. 11 is a diagram visually showing an analysis result produced by an analyzing unit according to embodiment 1.

FIG. 11 is a diagram visually showing an analysis result produced by analyzing unit 15. FIG. 11 shows control logic diagram 40 as an example control logic diagram. The example of FIG. 11 shows that control logic diagram 40 includes the control logic parts corresponding to the control logic part IDs "L1A" to "L3A".

[F4. Control Flow of Specifying Unit 16]

Figure 12:
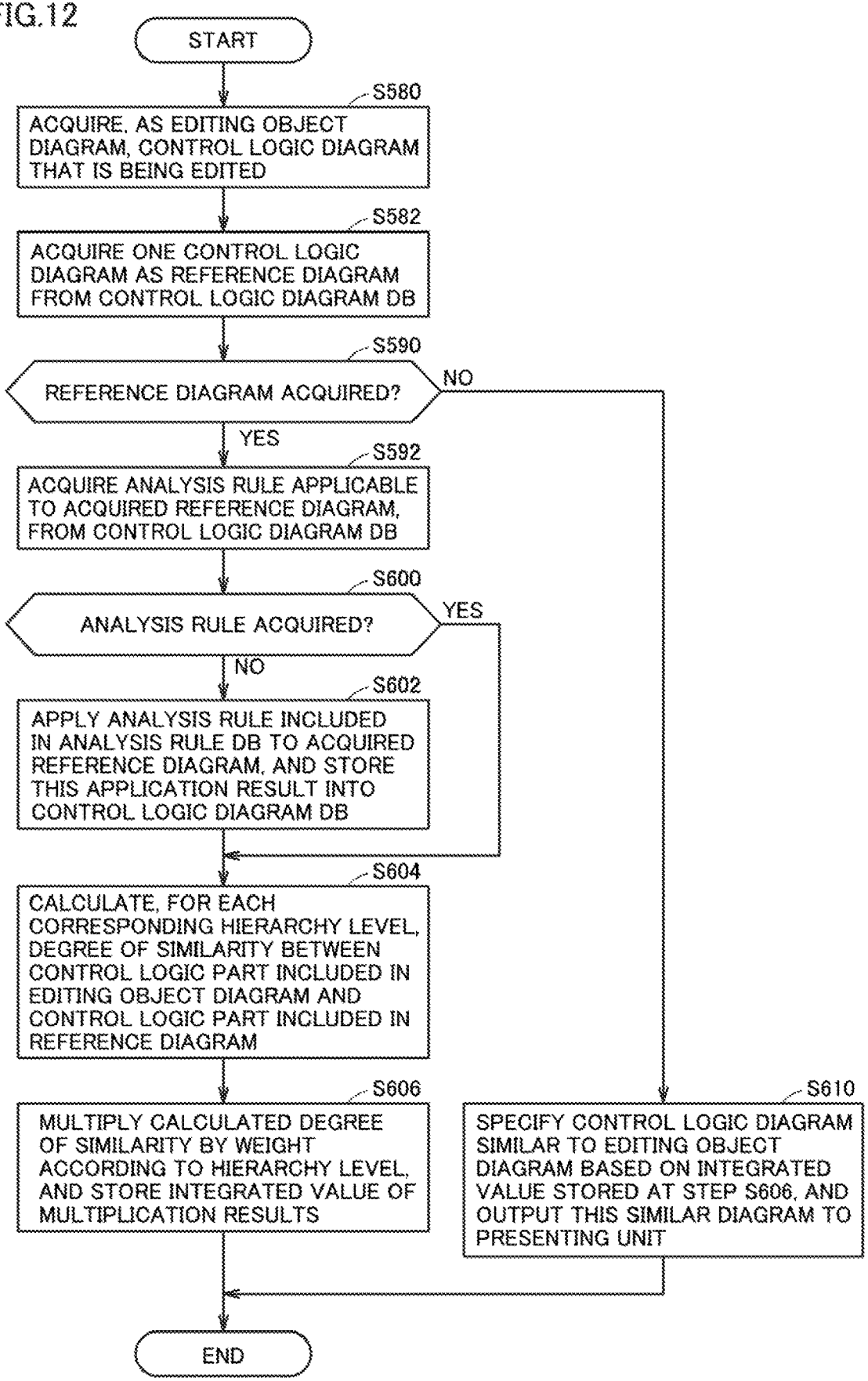
FIG. 12 is a flowchart showing the operation of a specifying unit according to embodiment 1.

Next, with reference to FIG. 12, the control flow of specifying unit 16 is described. FIG. 12 is a flowchart showing the operation of specifying unit 16.

At step S580, specifying unit 16 acquires a control logic diagram that is currently being edited (i.e., an editing object diagram) from the editing screen for the control logic diagram.

At step S582, specifying unit 16 acquires one control logic diagram (i.e., a reference diagram) from control logic diagram DB 20.

At step S590, specifying unit 16 determines whether or not a reference diagram was acquired at step S582. If a reference diagram was not acquired, it means that the process has been completed for all the reference diagrams. If specifying unit 16 determines that a reference diagram was acquired at step S582 (YES at step S590), specifying unit 16 switches the control to step S592. Otherwise (NO at step S590), specifying unit 16 switches the control to step S610.

At step S592, specifying unit 16 acquires, from control logic diagram DB 20 (see FIG. 10), an analysis rule applicable to the reference diagram acquired at step S582.

At step S600, specifying unit 16 determines whether or not an applicable analysis rule was acquired at step S592. If specifying unit 16 determines that an applicable analysis rule was acquired at step S592 (YES at step S600), specifying unit 16 switches the control to step S604. Otherwise (NO at step S600), specifying unit 16 switches the control to step S602.

At step S602, specifying unit 16 applies each analysis rule included in analysis rule DB 30 to the reference diagram acquired at step S582, and stores the application result into control logic diagram DB 20. The method of applying the analysis rule is as described above with reference to FIG. 8 and FIG. 9, and thus the description is not repeated.

At step S604, specifying unit 16 calculates, for each corresponding hierarchy level, the degree of similarity between the control logic part included in the editing object diagram acquired at step S580, and the control logic part included in the reference diagram acquired at step S582. The degree of similarity is calculated based on the proportion of the operation elements and signal lines that correspond between both control logic parts, to the operation elements and signal lines included in both control logic parts. By way of example, the function for calculating the degree of similarity is preferably an increasing function of the number of operation elements and signal lines that correspond between both control logic parts, and a decreasing function of the number of operation elements and signal lines that do not correspond. The function may be expressed by, for example, equation (3) as below.

$$s3 = 2*\{\beta Nb + (1-\beta)Lb\}/\{(\beta(N2+N3)+(1-\beta)(L2+L3)\} \quad (3)$$

The character "s3" in equation (3) denotes the degree of similarity between the control logic parts included in the editing object diagram and the reference diagram.

The character "Nb" in equation (3) denotes the number of operation elements that correspond between both control logic parts. The character "Lb" in equation (3) denotes the number of signal lines that correspond between both control logic parts. The character "N2" in equation (3) denotes the number of operation elements included in the editing object diagram at the matching portion that matches with the analysis rule. The character "L2" denotes the number of signal lines included in the editing object diagram at the matching portion that matches with the analysis rule. The character "N3" in equation (3) denotes the number of operation elements included in the similar diagram at the matching portion that matches with the analysis rule. The character "L3" denotes the number of signal lines included in the similar diagram at the matching portion that matches with the analysis rule. The character "β" in equation (3) is a parameter of not less than 0 and not more than 1.

At step S606, specifying unit 16 multiplies each degree of similarity calculated at step S604 by a weight according to the hierarchy level. At this time, the higher the level of the analysis rule to be applied is, the heavier the multiplied weight is. As a result, as the similarity in the control logic part between the editing object diagram and the reference diagram becomes higher at a higher hierarchy level, the degree of similarity with respect to the reference diagram becomes higher. After that, specifying unit 16 integrates the weighted degrees of similarity. This calculation is based on, for example, equation (4) as below.

$$s4 = w3*s3a + w2*s3b + w1*s3c(w3 < w2 < w1) \quad (4)$$

The characters "w1" to "w3" in equation (4) denote weights. The character "w3" is a weight corresponding to the hierarchy level at the lowest layer. By way of example, the value of "w3" is 1. The character "w2" is a weight corresponding to the hierarchy level that is one level higher than the lowest layer. By way of example, the value of "w2" is 10. The character "w1" is a weight corresponding to the hierarchy level that is two levels higher than the lowest layer. The value of "w1" is 100. The characters "s3a" to "s3c" in equation (4) each correspond to the degree of similarity "s3" in equation (3) calculated for a corresponding hierarchy.

Although equation (4) includes three terms by way of example, the number of terms in equation (4) may be modified in accordance with the number of the matched analysis rules. Also, the method of calculating the degree of similarity between the editing object diagram and the reference diagram is not limited to equations (3), (4), but any calculation method may be employed that can calculate the degree of similarity between the editing object diagram and the reference diagram.

Specifying unit 16 stores the integrated value obtained by the integration process using equation (4). The integrated value may be stored in storage device 3 of design support apparatus 100, or may be stored in an external storage device, such as a server.

At step S610, specifying unit 16 specifies, as a similar diagram, a reference diagram similar to editing object diagram 10, based on the integrated value "s4" for each reference diagram stored at step S606. By way of example, specifying unit 16 specifies, as a similar diagram, the reference diagram having the maximum integrated value "s4". Alternatively, specifying unit 16 specifies, as a similar diagram, the reference diagram having an integrated value "s4" higher than a predetermined threshold value. The similar diagram is outputted to presenting unit 18.

[F5. Control Flow of Presenting Unit 18]

Figure 13:
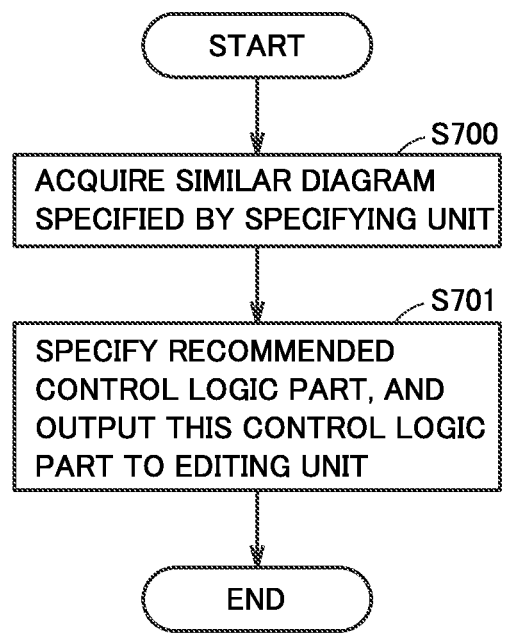
FIG. 13 is a flowchart showing the operation of a presenting unit according to embodiment 1.
Figure 14:
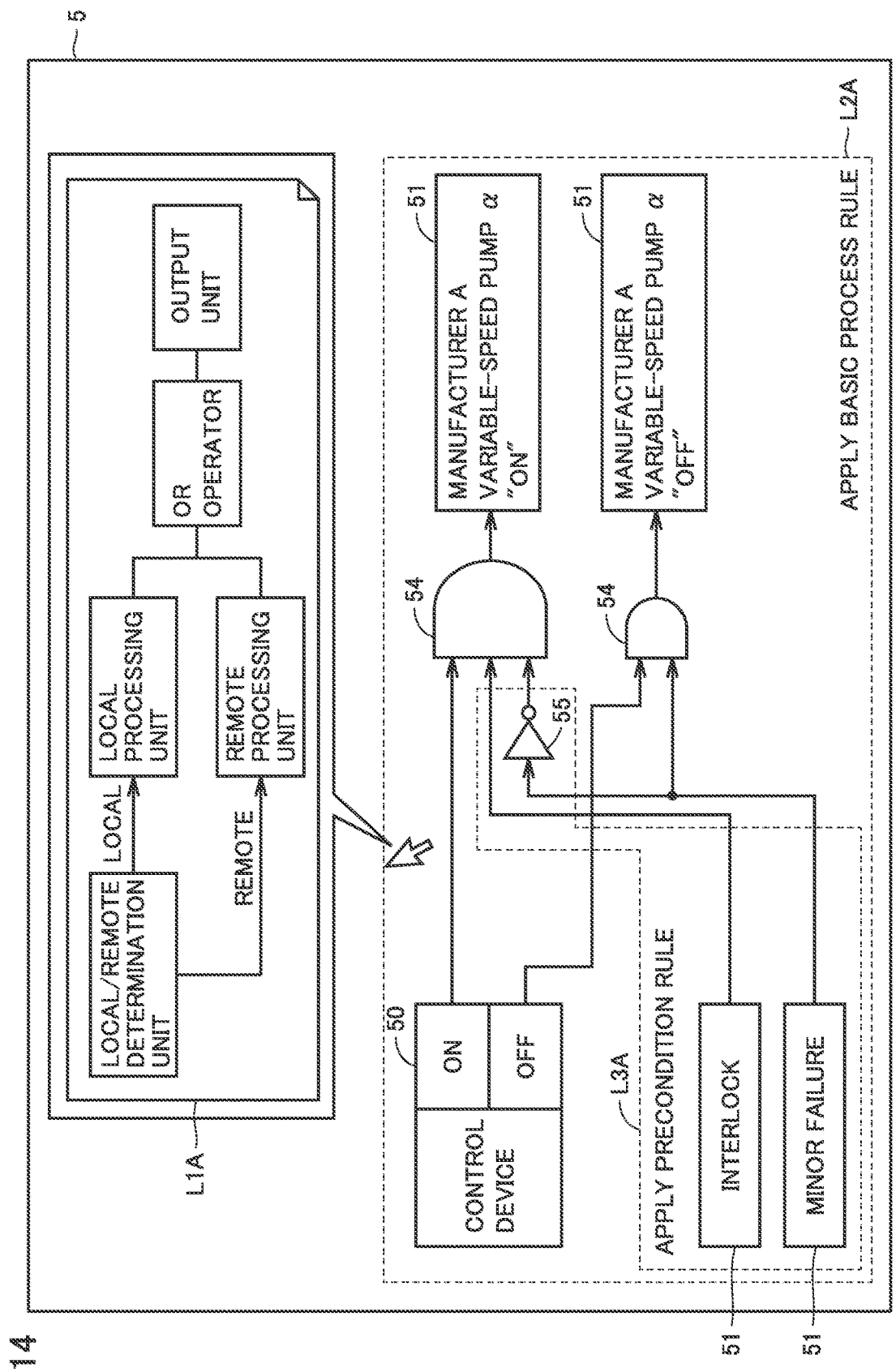
FIG. 14 is a diagram showing an example setting screen on which a recommended control logic part is displayed.

Next, with reference to FIG. 13 and FIG. 14, the control flow of presenting unit 18 is described. FIG. 13 is a flowchart showing the operation of presenting unit 18.

At step S700, presenting unit 18 acquires a similar diagram specified by specifying unit 16.

At step S701, presenting unit 18 specifies, as a recommended object, a control logic part having a hierarchical relation with the control logic part shared in common with the editing object diagram, among the control logic parts included in the similar diagram. Typically, presenting unit 18 specifies, as a recommended object, a control logic part that is at a higher level than the control logic part shared in common with editing object diagram 10, among the control logic parts included in the similar diagram. The recommended control logic part is outputted to editing unit 12.

<G. Mode of Presenting Control Logic Part>

FIG. 14 is a diagram showing an example setting screen on which a recommended control logic part is displayed. In the example of FIG. 14, the control logic parts corresponding to the control logic part IDs "L2A", "L3A" are displayed as objects to be edited in the control logic diagram that is being edited.

As a recommended object corresponding to the control logic parts, the control logic part corresponding to the control logic part ID "L1A" is displayed as a recommended object. The user can reflect the recommended control logic part in the setting screen by designating the recommended control logic part.

<H. Advantages>

As described above, design support apparatus 100 according to the present embodiment analyzes the similarity between editing object diagram 10 and reference diagram 21 using analysis rules having a hierarchical relation. Thus, design support apparatus 100 can recommend a control logic by focusing not on the local similarity but on the global similarity in the control logic diagram. Thus, an appropriate control logic part can be presented even if many kinds of control logic parts are included, and the user's design efficiency can be improved.

Embodiment 2

<I. Outline>

Figure 15:
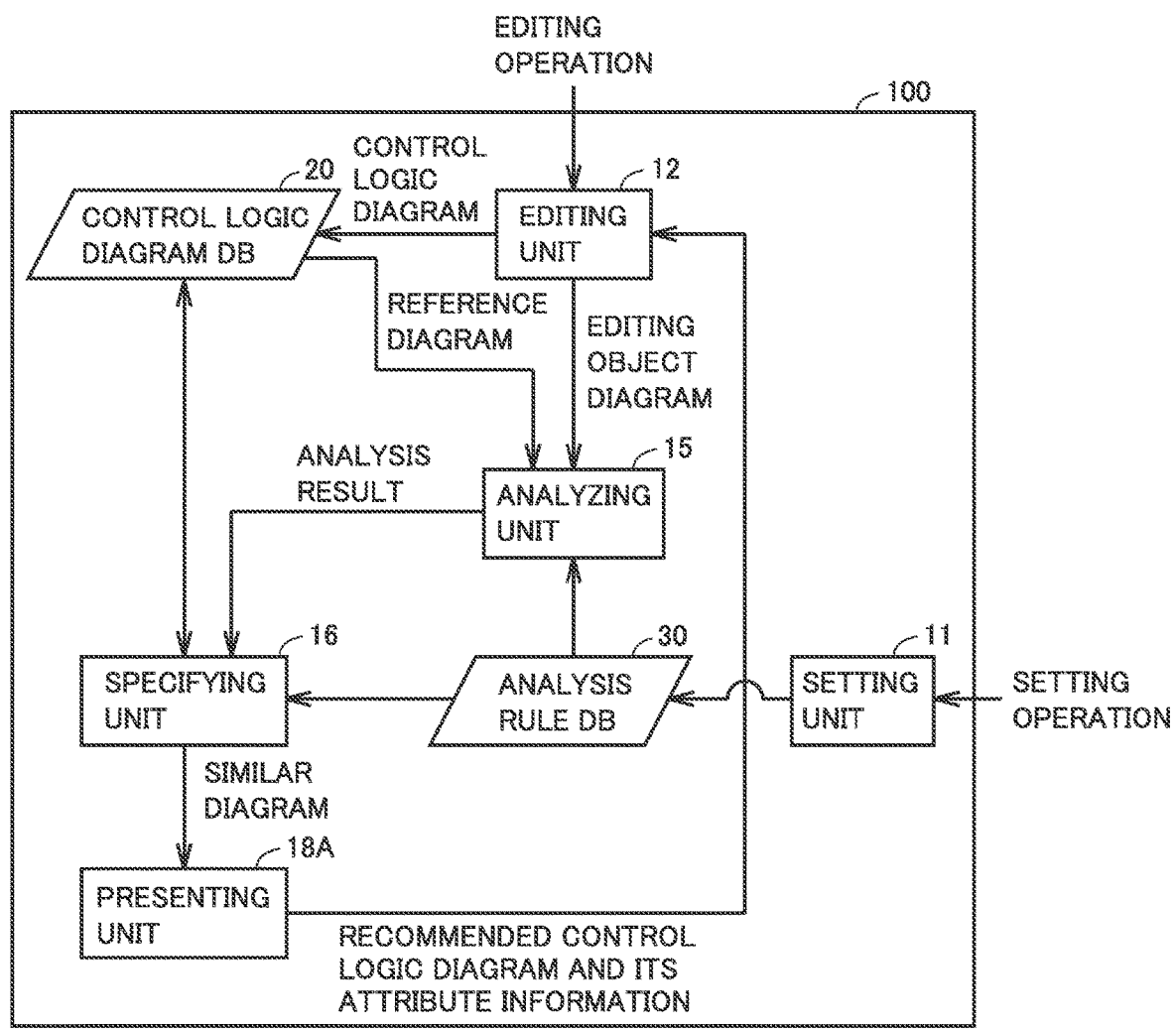
FIG. 15 is a diagram showing an example functional configuration of a design support apparatus according to embodiment 2.

With reference to FIG. 15, the function of design support apparatus 100 according to embodiment 2 is described. FIG.

15 is a diagram showing an example functional configuration of design support apparatus 100 according to embodiment 2.

Design support apparatus 100 according to embodiment 1 specifies a recommended control logic part and presents the control logic part to the user. In contrast, design support apparatus 100 according to embodiment 2 not only presents a recommended control logic part, but also displays the attribute information of the control logic part as a reason for recommendation.

More specifically, design support apparatus 100 according to embodiment 2 includes a presenting unit 18A for presenting a recommended control logic part and the attribute information of the control logic part, instead of presenting unit 18 for presenting a recommended control logic part. The attribute information is information that relates to a recommended control logic part. Since the attribute information is presented as a reason for recommendation, the user can easily choose an appropriate control logic part, thus further improving the design efficiency of control logic diagrams.

The other features are the same as those of design support apparatus 100 according to embodiment 1, and thus the description thereof is not repeated.

<J. Control Flow of Presenting Unit 18A>

With reference to FIG. 16, the control flow of presenting unit 18A is described. FIG. 16 is a flowchart showing the operation of presenting unit 18A.

At step S700, presenting unit 18A acquires, from specifying unit 16, a control logic diagram (i.e., a similar diagram) similar to an editing object diagram.

At step S701, presenting unit 18A specifies, as a recommended object, a control logic part having a hierarchical relation with the control logic part shared in common with the editing object diagram, among the control logic parts included in the similar diagram. Typically, presenting unit 18A specifies, as a recommended object, a control logic part that is at a higher level than the control logic part shared in common with editing object diagram 10, among the control logic parts included in the similar diagram. The recommended control logic part is outputted to editing unit 12.

At step S702, presenting unit 18A acquires the attribute information of the recommended control logic part. The attribute information is acquired from, for example, control logic diagram DB 20 or analysis rule DB 30. Examples of the attribute information include the analysis rule applied to the recommended control logic part, the hierarchy level of the analysis rule, and the name of the recommended control logic part.

<K. Advantages>

As described above, design support apparatus 100 according to the present embodiment not only presents a recommended control logic part, but also displays the attribute information of the control logic part as a reason for recommendation. Thus, the user can more easily choose an appropriate control logic part, thus further improving the design efficiency of control logic diagrams.

It should be understood that the embodiments disclosed herein are by way of example in every respect, and not by way of limitation. The scope of the present invention is defined not by the above description but by the terms of the claims, and is intended to include any modification within the meaning and scope equivalent to the terms of the claims.

REFERENCE SIGNS LIST 1A, 2A, 2B, 3A, 3B, 3C, 3D: analysis rule; 2: control device; 3: storage device; 4: input device; 5: output device; 7A, 8A, 8B, 9A, 9B, 9C, 9D: control logic part; 10: editing object diagram; 11: setting unit; 12: editing unit; 15: analyzing unit; 16: specifying unit; 18, 18A: presenting unit; 20: control logic diagram DB; 21, 21A, 21B: reference diagram; 23: analysis result; 24: hierarchical analysis rule ID; 25: hierarchy level; 26: control logic part ID; 30: analysis rule DB; 30A: hierarchical analysis rule; 40: control logic diagram; 50: device component; 51: process; 52: connecting line; 53: OR operator; 54: AND operator; 55: NOT operator; 56: branch point; 80: process part; 81: AND operator part; 82: NOT operator part; 83: OR operator part; 100: design support apparatus

The invention claimed is:

1. A design support method to be executed by a design support apparatus,
the design support apparatus comprising:
an output device;
a control device; and
a storage device to store a plurality of control logic diagrams, each control logic diagram being composed of a control logic part defining a control content,
wherein each of the plurality of control logic diagrams includes:
a plurality of reference diagrams created in the past as a control logic diagram; and
an editing object diagram which is a control logic diagram to be edited, the design support method comprising:
acquiring, by the control device, the plurality of control logic diagrams from the storage device;
applying, by the control device, each of a plurality of analysis rules for analyzing the control logic part included in each of the plurality of control logic diagrams to each of the plurality of reference diagrams and to the editing object diagram, and analyzing, by the control device, the control logic part included in each of the plurality of reference diagrams and in the editing object diagram,
wherein the plurality of analysis rules are hierarchized and satisfy a relation in which a control logic part corresponding to an analysis rule at a higher hierarchy level contains a control logic part corresponding to an analysis rule at a lower hierarchy level, the design support method further comprising:
specifying as a similar diagram, by the control device, a reference diagram including a control logic part common with the control logic part included in the editing object diagram, among the plurality of reference diagrams, based on an analysis result of the analyzing; and
presenting on the output device, by the control device, a control logic part having a hierarchical relation with the common control logic part, among control logic parts included in the similar diagram.

2. The design support method according to claim 1, wherein
the control logic part presented in the presenting includes a control logic part at a higher hierarchy level than the common control logic part among the control logic parts included in the similar diagram.

3. The design support method according to claim 2, wherein
the control logic part presented in the presenting includes a control logic part at a highest hierarchy level among the control logic parts included in the similar diagram.

4. The design support method according to claim 2, wherein the specifying includes:
comparing, by the control device, for each of the plurality of reference diagrams, the control logic part included in the reference diagram with the control logic part included in the editing object diagram for each corresponding hierarchy level, and calculating a degree of similarity of each of the plurality of reference diagrams with the editing object diagram; and specifying as the similar diagram, by the control device, a reference diagram having the degree of similarity higher than a predetermined value.

5. The design support method according to claim 2, wherein
the presenting includes further presenting, by the control device, attribute information of the control logic part to be presented.

6. The design support method according to claim 1, wherein
the control logic part presented in the presenting includes a control logic part at a highest hierarchy level among the control logic parts included in the similar diagram.

7. The design support method according to claim 6, wherein
the specifying includes:
comparing, by the control device, for each of the plurality of reference diagrams, the control logic part included in the reference diagram with the control logic part included in the editing object diagram for each corresponding hierarchy level, and calculating a degree of similarity of each of the plurality of reference diagrams with the editing object diagram; and specifying as the similar diagram, by the control device, a reference diagram having the degree of similarity higher than a predetermined value.

8. The design support method according to claim 6, wherein
the presenting includes further presenting, by the control device, attribute information of the control logic part to be presented.

9. The design support method according to claim 1, wherein the specifying includes:
comparing, by the control device, for each of the plurality of reference diagrams, the control logic part included in the reference diagram with the control logic part included in the editing object diagram for each corresponding hierarchy level, and calculating a degree of similarity of each of the plurality of reference diagrams with the editing object diagram; and specifying as the similar diagram, by the control device, a reference diagram having the degree of similarity higher than a predetermined value.

10. The design support method according to claim 9, wherein
in the calculating, when the control device compares the control logic part included in each of the plurality of reference diagrams with the control logic part included in the editing object diagram for each corresponding hierarchy level, the control device calculates the degree of similarity in such a way that a comparison result of a control logic part at a higher hierarchy level is more heavily weighted.

11. The design support method according to claim 10, wherein the presenting includes further presenting, by the control device, attribute information of the control logic part to be presented.

12. The design support method according to claim 9, wherein
the presenting includes further presenting, by the control device, attribute information of the control logic part to be presented.

13. The design support method according to claim 1, wherein
the presenting includes further presenting, by the control device, attribute information of the control logic part to be presented.

14. A design support apparatus comprising:
a storage unit to store a plurality of control logic diagrams, each control logic diagram being composed of a control logic part defining a control content,
wherein each of the control logic diagrams includes:
a plurality of reference diagrams created in the past as a control logic diagram; and
an editing object diagram which is a control logic diagram to be edited, the design support apparatus further comprising:
an analyzing unit to apply each of a plurality of analysis rules for analyzing the control logic part included in each of the plurality of control logic diagrams to each of the plurality of reference diagrams and to the editing object diagram, and analyze the control logic part included in each of the plurality of reference diagrams and in the editing object diagram,
wherein the plurality of analysis rules are hierarchized and satisfy a relation in which a control logic part corresponding to an analysis rule at a higher hierarchy level contains a control logic part corresponding to an analysis rule at a lower hierarchy level, the design support apparatus further comprising:
a specifying unit to specify, as a similar diagram, a reference diagram including a control logic part common with the control logic part included in the editing object diagram, among the plurality of reference diagrams, based on an analysis result produced by the analyzing unit; and
a presenting unit to present a control logic part having a hierarchical relation with the common control logic part, among control logic parts included in the similar diagram.

15. A non-transitory recording medium storing a design support program to be executed by a computer, the design support program being configured to cause the computer to execute:
acquiring a plurality of control logic diagrams, each control logic diagram being composed of a control logic part defining a control content,
wherein each of the plurality of control logic diagrams includes:
a plurality of reference diagrams created in the past as a control logic diagram; and
an editing object diagram which is a control logic diagram to be edited, the design support program being further configured to cause the computer to execute:
applying each of a plurality of analysis rules for analyzing the control logic part included in each of the plurality of control logic diagrams to each of the plurality of reference diagrams and to the editing object diagram, and analyzing the control logic part included in each of the plurality of reference diagrams and in the editing object diagram, wherein the plurality of analysis rules are hierarchized and satisfy a relation in which a control logic part corresponding to an analysis rule at a higher hierarchy level contains a control logic part corresponding to an analysis rule at a lower hierarchy level, the design support program being further configured to cause the computer to execute:

specifying, as a similar diagram, a reference diagram including a control logic part common with the control logic part included in the editing object diagram, among the plurality of reference diagrams, based on an analysis result of the analyzing; and presenting a control logic part having a hierarchical relation with the common control logic part, among control logic parts included in the similar diagram.

* * * * *